United States Patent
Chae et al.

(10) Patent No.: US 6,777,987 B2
(45) Date of Patent: Aug. 17, 2004

(54) SIGNAL BUFFER FOR HIGH-SPEED SIGNAL TRANSMISSION AND SIGNAL LINE DRIVING CIRCUIT INCLUDING THE SAME

(75) Inventors: Moo-sung Chae, Seoul (KR); Chi-wook Kim, Kyungki-do (KR); Sung-min Seo, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/394,682

(22) Filed: Mar. 21, 2003

(65) Prior Publication Data

US 2004/0027178 A1 Feb. 12, 2004

(30) Foreign Application Priority Data

Aug. 7, 2002 (KR) .................................. 10-2002-0046574

(51) Int. Cl.[7] ................................................. H03K 3/00
(52) U.S. Cl. ........................ 327/112; 327/112; 327/374; 327/379; 326/86; 326/87
(58) Field of Search ................................. 327/108, 109, 327/110, 111, 112, 374, 376, 377, 379; 326/20, 24, 82, 85, 86, 87

(56) References Cited

U.S. PATENT DOCUMENTS

| | | | | |
|---|---|---|---|---|
| 4,825,099 A | * | 4/1989 | Barton | .......................... 326/86 |
| 5,489,866 A | * | 2/1996 | Diba | ........................... 327/206 |
| 5,541,528 A | * | 7/1996 | Montoye et al. | ............... 326/34 |
| 5,726,583 A | * | 3/1998 | Kaplinsky | ...................... 326/30 |
| 5,781,034 A | * | 7/1998 | Rees et al. | ...................... 326/86 |
| 6,097,216 A | * | 8/2000 | Youn | ............................ 326/71 |
| 6,281,730 B1 | * | 8/2001 | Vu | ............................... 327/170 |

* cited by examiner

*Primary Examiner*—Timothy P. Callahan
*Assistant Examiner*—An T. Luu
(74) *Attorney, Agent, or Firm*—Mills & Onello LLP

(57) ABSTRACT

A signal line driving circuit includes an inversion buffer, a pulse generator, a first signal buffer, and a second signal buffer. Here, the inversion buffer receives an input signal and includes an output terminal connected to the signal line to drive the signal line. The pulse generator receives the input signal to generate a pulse signal. The first signal buffer has a control terminal connected to an output terminal of the pulse generator and an input/output terminal connected to a node of the signal line. The first signal buffer reduces the rising transition time of a signal propagating on the signal line in response to a first control signal. The second signal buffer has a control terminal connected to the output terminal of the pulse generator and an input/output terminal connected to the node of the signal line. The second signal buffer reduces the falling transition time of a signal propagating on the signal line in response to a first control signal.

45 Claims, 7 Drawing Sheets

SIGNAL BUFFER FOR HIGH-SPEED SIGNAL TRANSMISSION AND SIGNAL LINE DRIVING CIRCUIT INCLUDING THE SAME

BACKGROUND OF THE INVENTION

This application claims the priority of Korean Patent Application No. 2002-46574, filed Aug. 7, 2002 in the Korean Intellectual Property Office, which is incorporated herein in its entirety by reference.

1. Field of the Invention

The present invention relates to a semiconductor integrated circuit (IC), and more particularly, to a signal buffer for high-speed signal transmission and a signal line driving circuit including the same.

2. Description of the Related Art

As shown in FIG. 1, when the load capacitance of a signal line 11, which transmits a signal in a semiconductor IC, is large, and when the parasitic resistance and the parasitic capacitance of the signal line 11 are large, the transmission speed of the signal transmitted through the signal line 11 is reduced, and signal distortion may occur.

In a conventional approach for addressing this issue, as shown in FIG. 2, inverter-type signal buffers 24 and 25 are installed at predetermined locations along a a signal line 21 in order to prevent the signal distortion and in order to improve signal transmission speed.

However, when the inverter-type signal buffers 24, 25 are employed, the inverter causes an additional propagation delay along the signal line. In addition, the signal buffers 24, 25 increase the occupied surface area of the integrated circuit.

SUMMARY OF THE INVENTION

The present invention provides a signal buffer for improving the transmission speed of a signal on a signal line while occupying a relatively small area of an integrated circuit.

The present invention also provides a signal line driving circuit including a signal buffer, which improves the transmission speed of a signal while occupying a relatively small area of an integrated circuit.

According to a first aspect of the present invention, there is provided a signal buffer comprising a pull-up driver for pulling up an input/output terminal in response to a first control signal, and a control circuit for detecting a rising transition of a signal applied to the input/output terminal in response to a second control signal applied to the control terminal in order to generate the first control signal.

Here, the pull-up driver comprises a PMOS transistor having a source receiving a power voltage, a gate receiving the control signal, and a drain connected to the input/output terminal.

The control circuit comprises a PMOS transistor having a source coupled to a voltage supply, a gate connected to the control terminal, and a drain outputting the first control signal; a first NMOS transistor having a drain connected to the drain of the PMOS transistor and a gate connected to the input/output terminal; and a second NMOS transistor having a drain connected to the source of the first NMOS transistor, a gate connected to the control terminal, and a source coupled to a ground supply.

According to a second aspect of the present invention, there is provided a signal buffer comprising a pull-down driver for pulling down an input/output terminal in response to a first control signal, and a control circuit for detecting a falling transition of a signal applied to the input/output terminal in response to a second control signal applied to a control terminal in order to generate the first control signal.

Here, the pull-down driver comprises an NMOS transistor having a drain connected to the input/output terminal, a gate receiving the first control signal, and a source coupled to a ground supply.

The control circuit comprises a first PMOS transistor having a source coupled to a voltage supply and a gate connected to the control terminal; a second PMOS transistor having a source connected to a drain of the first PMOS transistor, a gate connected to the input/output terminal, and a drain outputting the first control signal; and an NMOS transistor having a drain connected to the drain of the second PMOS transistor, a gate connected to the control terminal, and a source receiving a ground supply.

The signal buffer according to the first and second aspects of the present invention may further comprise an inversion delay for inverting and delaying the signal applied to the input/output terminal and for providing the inverting delayed signal to the control terminal, and a latch circuit for latching the first control signal.

According to another aspect of the present invention, a signal line driving circuit comprises an inversion buffer, a pulse generator, a first signal buffer, and a second signal buffer.

Here, the inversion buffer receives an input signal and includes an output terminal connected to the signal line to drive the signal line. The pulse generator receives the input signal to generate a pulse signal.

The first signal buffer, corresponding to the signal buffer according to the first aspect of the present invention, has a control terminal connected to an output terminal of the pulse generator and an input/output terminal connected to a node of the signal line. The first signal buffer reduces the rising transition time of a signal propagating on the signal line in response to a first control signal.

The second signal buffer, corresponding to the signal buffer according to the second aspect of the present invention, has a control terminal connected to the output terminal of the pulse generator and an input/output terminal connected to node of the signal line. The second signal buffer reduces the falling transition time of a signal propagating on the signal line in response to a first control signal.

The signal line driving circuit may include any one signal buffer of the first and second signal buffers. In addition, the signal line driving circuit may include an inversion buffer rather than the pulse generator. Here, the inversion buffer performs inversion buffering of the input signal and generates an inverted signal which is applied to the control terminals of the first and second signal buffers.

According to a third aspect of the present invention, there is provided a signal line driving circuit comprising an inversion buffer, an inversion delay, a first signal buffer, and a second signal buffer.

Here, the inversion buffer receives an input signal and includes an output terminal connected to the signal line to drive the signal line. The inversion delay has an input terminal connected to a node of the signal line to invert and delay a signal propagating on the signal line at the node to provide a first control signal.

The first signal buffer, corresponding to the signal buffer according to the first aspect of the present invention, has a control terminal that receives the first control signal and an input/output terminal coupled to the node of the signal line. The first signal buffer reduces the rising transition time of the signal propagating on the signal line at the node in response to the first control signal.

The second signal buffer, corresponding to the signal buffer according to the second aspect of the present invention, has a control terminal that receives the first control signal and an input/output terminal coupled to the node of the signal line. The first signal buffer reduces the rising transition time of the signal propagating on the signal line at the node in response to the first control signal.

The signal line driving circuit according to the third aspect of the present invention may optionally include any one signal buffer of the first and second signal buffers.

BRIEF DESCRIPTION OF THE DRAWINGS

The above aspects and advantages of the present invention will become more apparent by describing in detail preferred embodiments thereof with reference to the attached drawings in which.

DETAILED DESCRIPTION OF PREFERRED EMBODIMENTS

The present invention will now be described more fully with reference to the accompanying drawings, in which preferred embodiments of the invention are shown.

Figure 1:
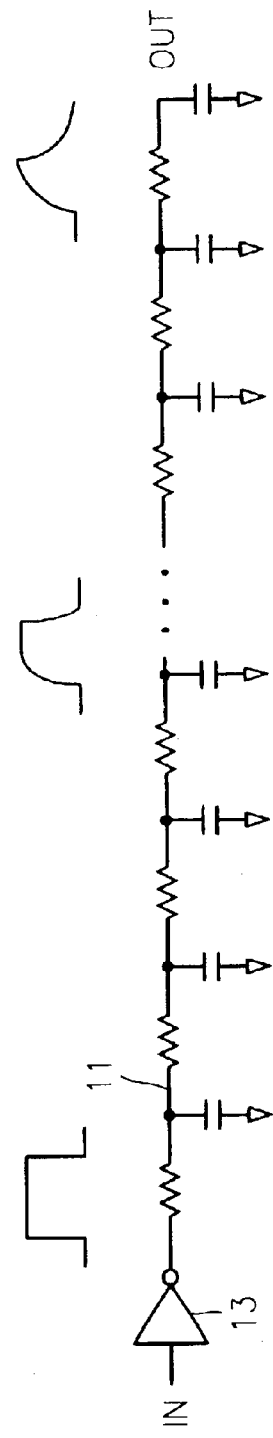
FIG. 1 illustrates distortions in a signal, that is transmitted through a conventional signal line.
Figure 2:
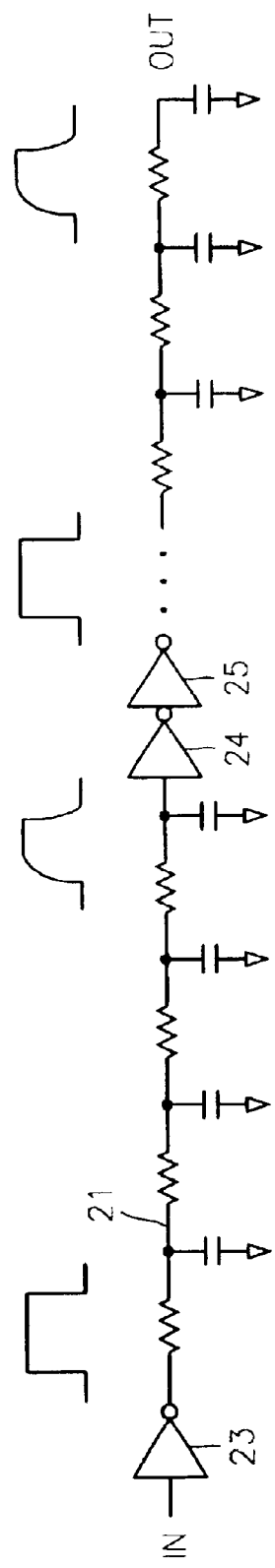
FIG. 2 illustrates a conventional signal line driving circuit for improving the signal distortion and transmission speed.
Figure 3:
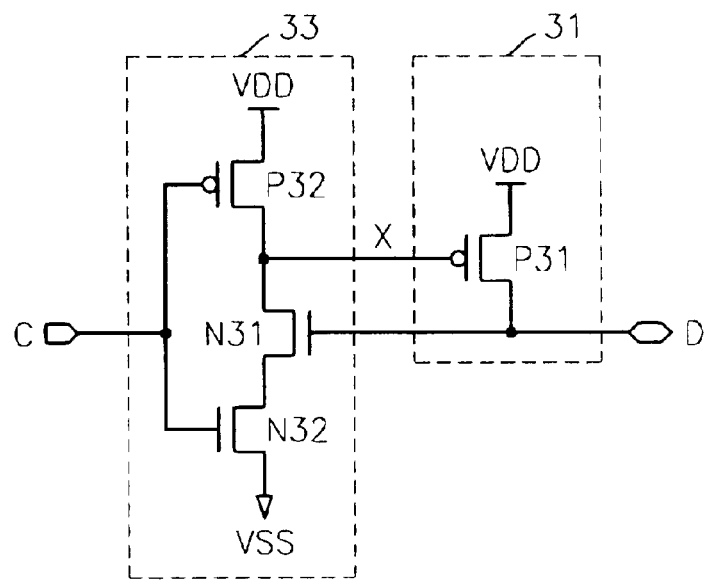
FIG. 3 is a circuit diagram illustrating a signal buffer according to a first embodiment of the present invention.
Figure 4:
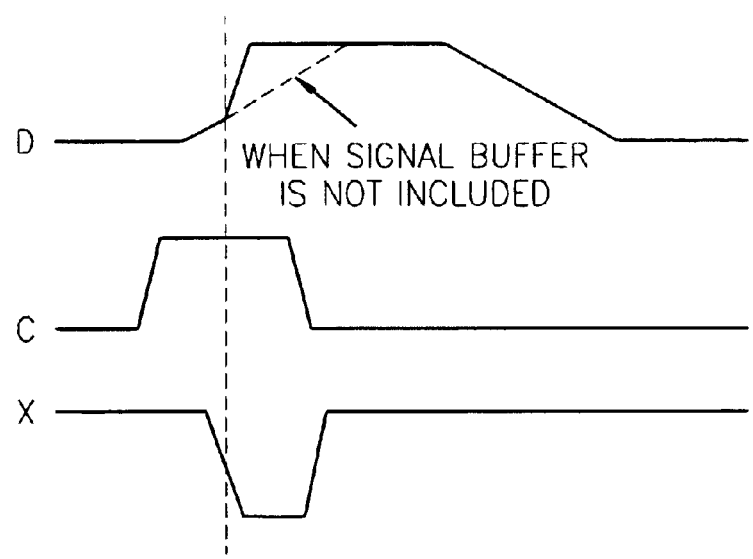
FIG. 4 is a waveform diagram illustrating an operating waveform of the signal buffer according to the first embodiment of FIG. 3.

FIG. 3 is a circuit diagram illustrating a signal buffer according to a first embodiment of the present invention and FIG. 4 is a waveform diagram illustrating an operating waveform of the signal buffer according to the first embodiment of FIG. 3.

Referring to FIG. 3, the signal buffer according to the first embodiment of the present invention utilizes a positive feedback configuration. Here, the signal buffer includes a pull-up driver 31 for pulling up an input/output terminal D in response to a control signal X, and a control circuit 33 for generating the control signal X by detecting the rising transition of a signal applied to the input/output terminal D in response to a status of a signal applied to a control terminal C.

The input/output terminal D is coupled to a predetermined location of a signal line. The pull-up driver 31 is formed of a PMOS transistor P31 in which a power voltage VDD is applied to a source, the control signal X is applied to a gate, and the input/output terminal D is connected to a drain.

The control circuit 33 includes a PMOS transistor P32, a first NMOS transistor N31, and a second NMOS transistor N32. In the PMOS transistor P32, the power voltage VDD is applied to a source, the control terminal C is connected to a gate, and the control signal X is output from a drain. In the first NMOS transistor N31, the drain of the PMOS transistor P32 is connected to a drain and the input/output terminal D is connected to a gate. In the second NMOS transistor N32, the source of the first NMOS transistor N31 is connected to a drain, the control terminal C is connected to a gate, and the ground voltage VSS is applied to a source.

The operation of the signal buffer according to the first embodiment of FIG. 3 will now be described with reference to the operating waveform of FIG. 4. As shown in FIG. 4, the signal buffer according to the first embodiment controls the rising transition of the signal applied to the input/output terminal D.

When the state of a signal input at the control terminal C is logic "0", the PMOS transistor P32 of the control circuit 33 is turned on so that the state of the control signal X becomes logic "1". Accordingly, the PMOS transistor P31 of the pull-up driver 31 is turned off. Thereafter, when the state of the signal input through the control terminal C becomes logic "1", the PMOS transistor P32 is turned off and the second NMOS transistor N32 is turned on.

When the signal of the input/output terminal D changes from logic "0" to logic "1", the first NMOS transistor N31 is turned on so that the control signal X becomes logic "0". Therefore, the PMOS transistor P31 of the pull-up driver 31 is turned on so that the signal of the input/output terminal D becomes logic "1" at a high speed. In other words, the speed of the rising transition of a signal applied to the input/output terminal D is improved in order to sharpen the rising slope.

Figure 5:
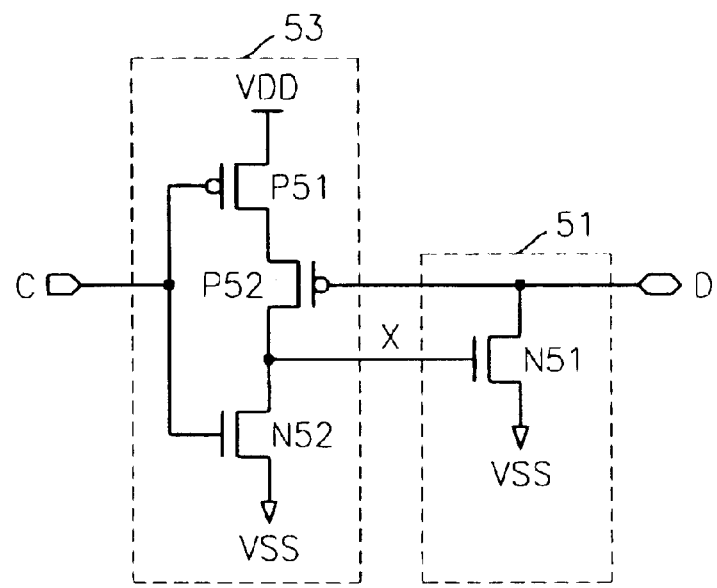
FIG. 5 is a circuit diagram illustrating a signal buffer according to a second embodiment of the present invention.
Figure 6:
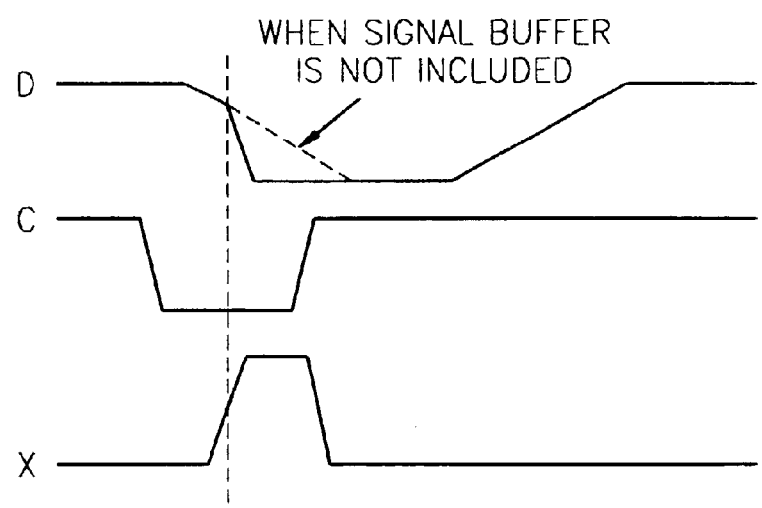
FIG. 6 is a waveform diagram illustrating an operating waveform of the signal buffer according to the second embodiment of FIG. 5.

FIG. 5 is a circuit diagram illustrating a signal buffer according to a second embodiment of the present invention and FIG. 6 is a waveform diagram illustrating an operating waveform of the signal buffer according to the second embodiment of FIG. 5.

Referring to FIG. 5, the signal buffer according to the second embodiment of the present invention utilizes a positive feedback configuration. Here, the signal buffer includes a pull-down driver 51 for pulling down an input/output terminal D in response to the state of a control signal X, and a control circuit 53 for generating the control signal X by detecting the falling transition of a signal applied to the input/output terminal D in response to the state of a signal applied to control terminal C.

The input/output terminal D is coupled to a predetermined location of a signal line. The pull-down driver 51 is formed of an NMOS transistor N51 in which the input/output terminal D is connected to a drain, the control signal X is applied to a gate, and the ground voltage VSS is applied to a source.

The control circuit 53 includes a first PMOS transistor P51, a second PMOS transistor P52, and an NMOS transistor N52. In the first PMOS transistor P51, the power voltage VDD is applied to a source and the control terminal C is connected to a gate. In the second PMOS transistor P52, the drain of the first PMOS transistor P51 is connected to a source, the input/output terminal D is connected to a gate, and the control signal X is output from a drain. In the NMOS transistor N52, the drain of the second PMOS transistor P52 is connected to a drain, the control terminal C is connected to a gate, and the ground voltage VSS is applied to a source.

As shown in FIG. 6, the signal buffer according to the second embodiment controls the falling transition of a signal applied to the input/output terminal D. Since the operation of the signal buffer according to the second embodiment is similar to the operation of the signal buffer according to the first embodiment so that the descriptions about the operation of the signal buffer according to the second embodiment will not be repeated here.

Figure 7:
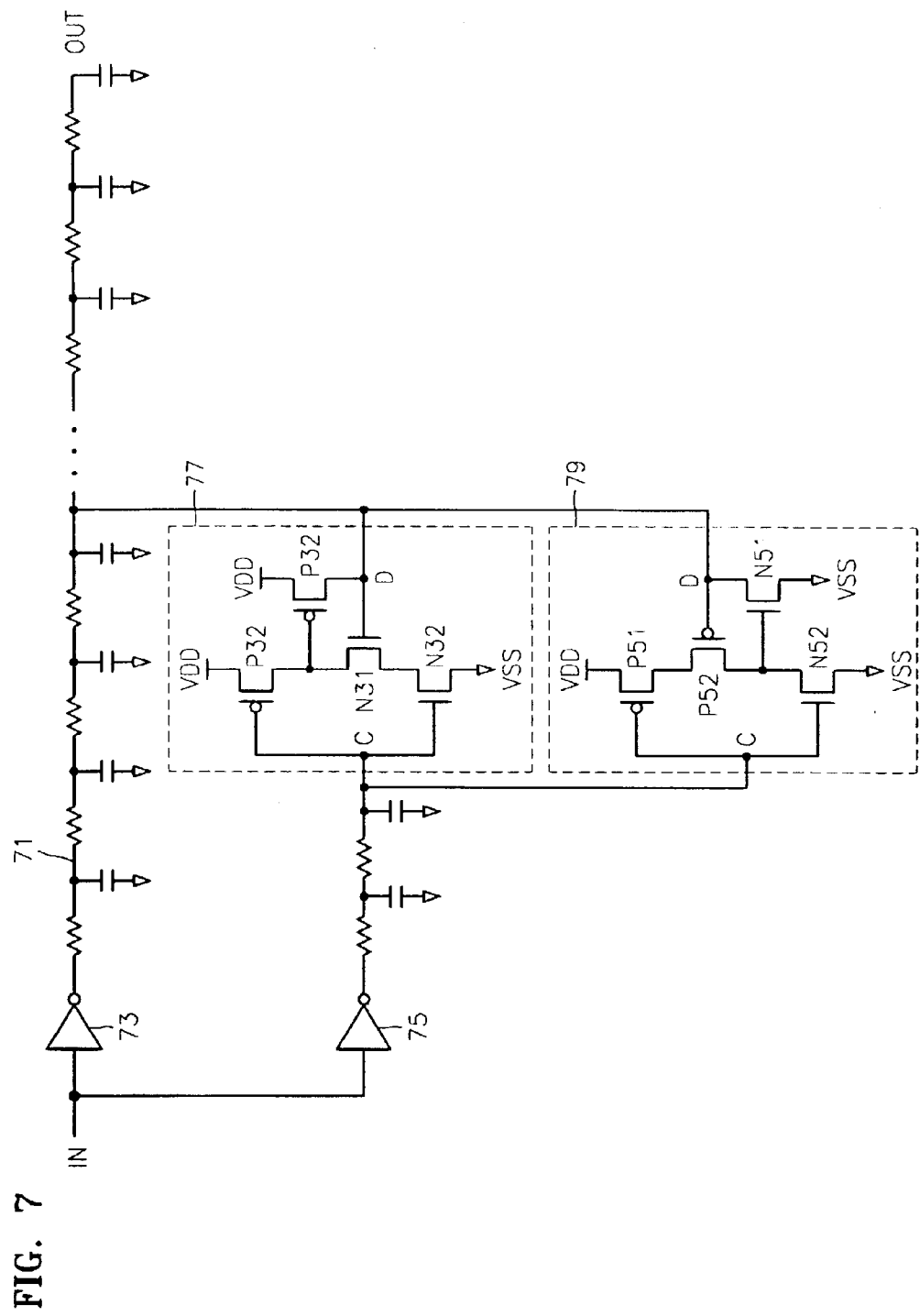
FIG. 7 illustrates a signal line driving circuit according to a first embodiment, which uses the signal buffers according to the first embodiment and the second embodiment.

FIG. 7 illustrates a signal line driving circuit according to a first embodiment, which employs the signal buffers according to the first embodiment illustrated above with reference to FIG. 3 and the second embodiment illustrated above with reference to FIG. 5.

Referring to FIG. 7, the signal line driving circuit according to the first embodiment includes an inversion buffer 73, a pulse generator 75, a first signal buffer 77, and a second signal buffer 79.

The inversion buffer 73, having an output terminal connected to a signal line 71, receives an input signal IN and drives the signal line 71. The pulse generator 75 receives the input signal IN and generates a pulse signal that is applied to the control terminal C, as shown above in FIGS. 4 and 6.

The first signal buffer 77, which is a signal buffer according to the first embodiment of FIG. 3, has a control terminal C connected to an output terminal of the pulse generator 75 and an input/output terminal D connected to a predetermined location of the signal line 71. The signal line between the output terminal of the pulse generator 75 and the control terminal C of the first signal buffer 77 has lower load capacitance, parasitic resistance, and parasitic capacitance, as compared to the signal line 71, which transmits the main signal. Therefore, the signal line between the output terminal of the pulse generator 75 and the control terminal C of the first signal buffer 77 provides an improved transmission speed, as compared to the signal line 71, while, at the same time, not generating signal distortion. Accordingly, the rising transition or the falling transition of the signal applied to the control terminal C as shown in FIG. 4 or 6 occurs prior to the rising transition or the falling transition of the signal input through the input/output terminal D.

The first signal buffer 77 increases the rising transition speed of the signal of the signal line 71 in response to the output signal of the pulse generator 75, which is input through the control terminal C, and in response to the signal of the signal line 71, which is input through the input/output terminal D. In other words, the first signal buffer 77 sharpens the rising slope of the signal of the signal line 71.

The second signal buffer 79, as a signal buffer according to the second embodiment of FIG. 5, includes a control terminal C connected to the output terminal of the pulse generator 75 and an input/output terminal D connected to a predetermined location of the signal line 71. The second signal buffer 79 improves the falling transition speed of the signal of the signal line 71 in response to the output signal of the pulse generator 75, which is input through the control terminal C, and in response to the signal of the signal line 71, which is input through the input/output terminal D. In other words, the second signal buffer 79 sharpens the falling slope of the signal of the signal line 71.

Here, reference numeral 75 denotes a pulse generator; however, an inversion buffer, which receives and inverts the input signal IN, can be substituted for the pulse generator. In addition, the signal line driving circuit according to the first embodiment is described above to include both the first signal buffer 77, which controls the rising slope of the signal of the signal line 71, and the second signal buffer 79, which controls the falling slope of the signal of the signal line 71. However, when necessary, the signal line driving circuit according to the first embodiment of the present invention may optionally include only one of the first signal buffer 77 and the second signal buffer 79.

Figure 8:
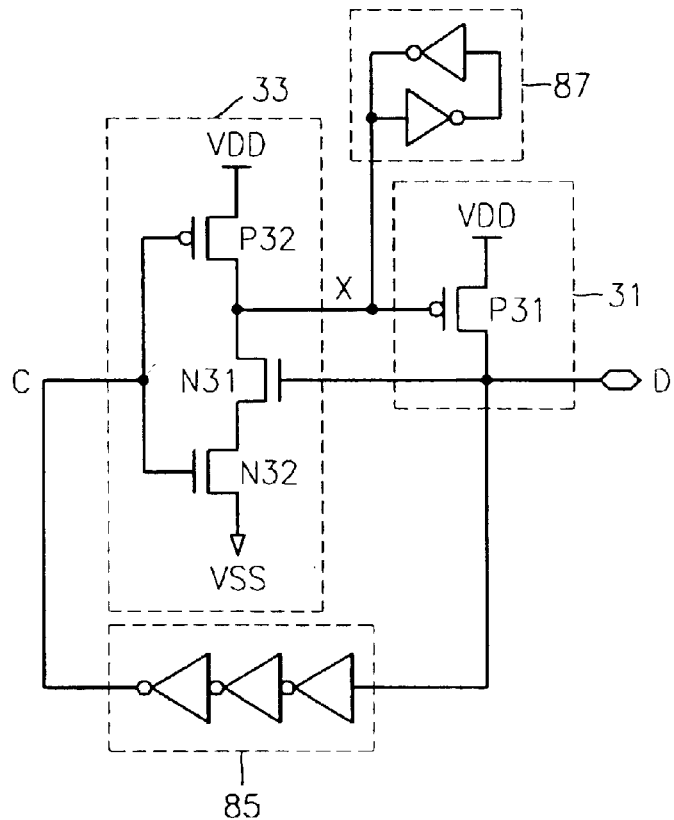
FIG. 8 is a circuit diagram illustrating a signal buffer according to a third embodiment of the present invention.
Figure 9:
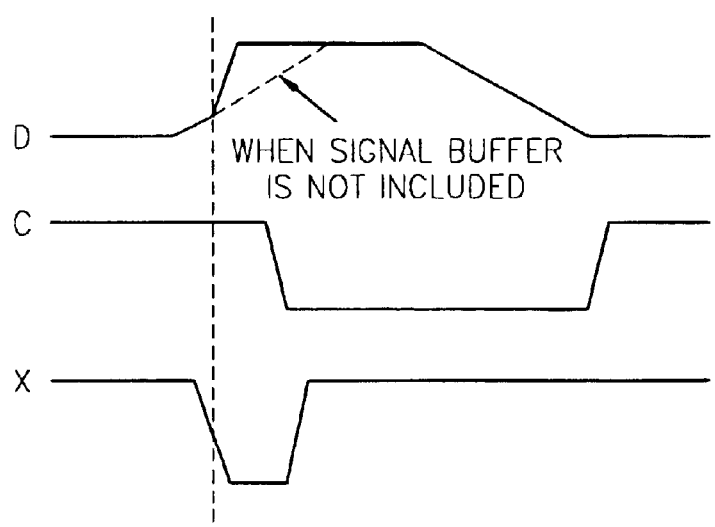
FIG. 9 is a waveform diagram illustrating an operating waveform of the signal buffer according to the third embodiment of FIG. 8.

FIG. 8 is a circuit diagram illustrating a signal buffer according to a third embodiment of the present invention and FIG. 9 is a waveform diagram illustrating an operating waveform of the signal buffer according to the third embodiment of FIG. 8.

Comparing the configuration the third embodiment of FIG. 8 to that of the first embodiment of FIG. 3, the signal buffer according to the third embodiment further includes an inversion delay 85 and a latch circuit 87. Here, the inversion delay 85 inverts and delays the signal applied to the input/output terminal D and supplies the inverted delayed signal to the control terminal C. Meanwhile, latch circuit 87 latches the control signal X.

Referring to the operating waveform of FIG. 9, when the state of the signal applied to the input/output terminal D is logic "0", the signal of the control terminal C becomes logic "1". Accordingly, a PMOS transistor P32 of a control circuit 33 is turned off and an NMOS transistor N32 is turned on. Therefore, the control signal X maintains the logic "1" state by the latch circuit 87 so that the PMOS transistor P31 of the pull-up driver 31 is turned off.

When the state of the signal at the input/output terminal D transitions from logic "0" to logic "1", the NMOS transistor N31 is turned on so that the control signal X becomes logic "0". Therefore, the PMOS transistor P31 of the pull-up driver 31 is turned on so that the signal of the input/output terminal D becomes logic "1" at a high speed. In other words, the speed of the rising transition of the signal of the input/output terminal D is improved in order to sharpen the rising slope.

Figure 10:
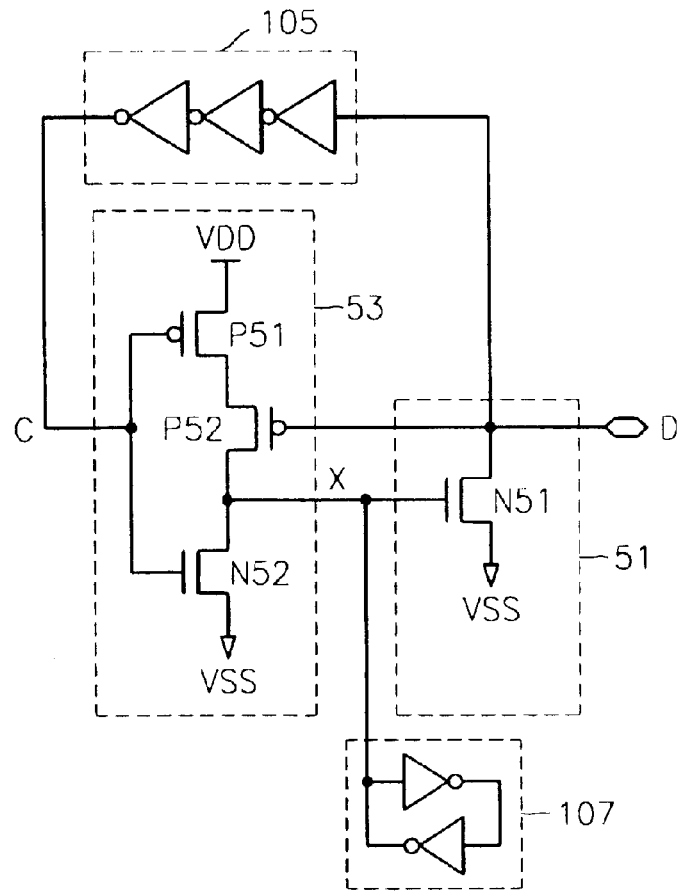
FIG. 10 is a circuit diagram illustrating a signal buffer according to a fourth embodiment of the present invention.
Figure 11:
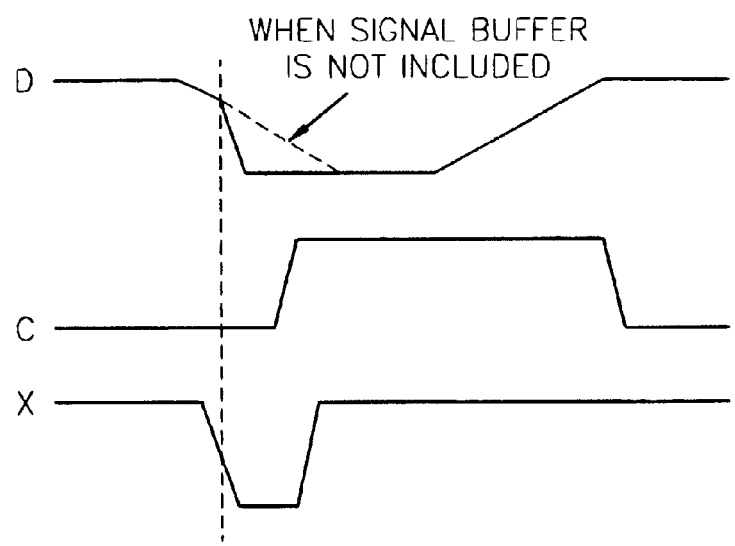
FIG. 11 is a waveform diagram illustrating an operating waveform of the signal buffer according to the fourth embodiment of the present invention.

FIG. 10 is a circuit diagram illustrating a signal buffer according to a fourth embodiment of the present invention and FIG. 11 is a waveform diagram illustrating an operating waveform of the signal buffer according to the fourth embodiment of FIG. 10.

Comparing the configuration the fourth embodiment of FIG. 10 to that of the second embodiment of FIG. 5, the signal buffer according to the fourth embodiment further includes an inversion delay 105 and a latch circuit 107. Here, the inversion delay 105 inverts and delays the signal applied to the input/output terminal D and supplies the inverted and delayed signal to the control terminal C. Meanwhile, the latch circuit 107 latches control signal X.

As shown in FIG. 11, the signal buffer according to the fourth embodiment controls the falling transition of the signal of the input/output terminal D. Since the operation of the signal buffer according to the fourth embodiment is similar to the operation of the signal buffer according to the third embodiment, the description of the operation of the signal buffer according to the fourth embodiment will not be repeated.

Figure 12:
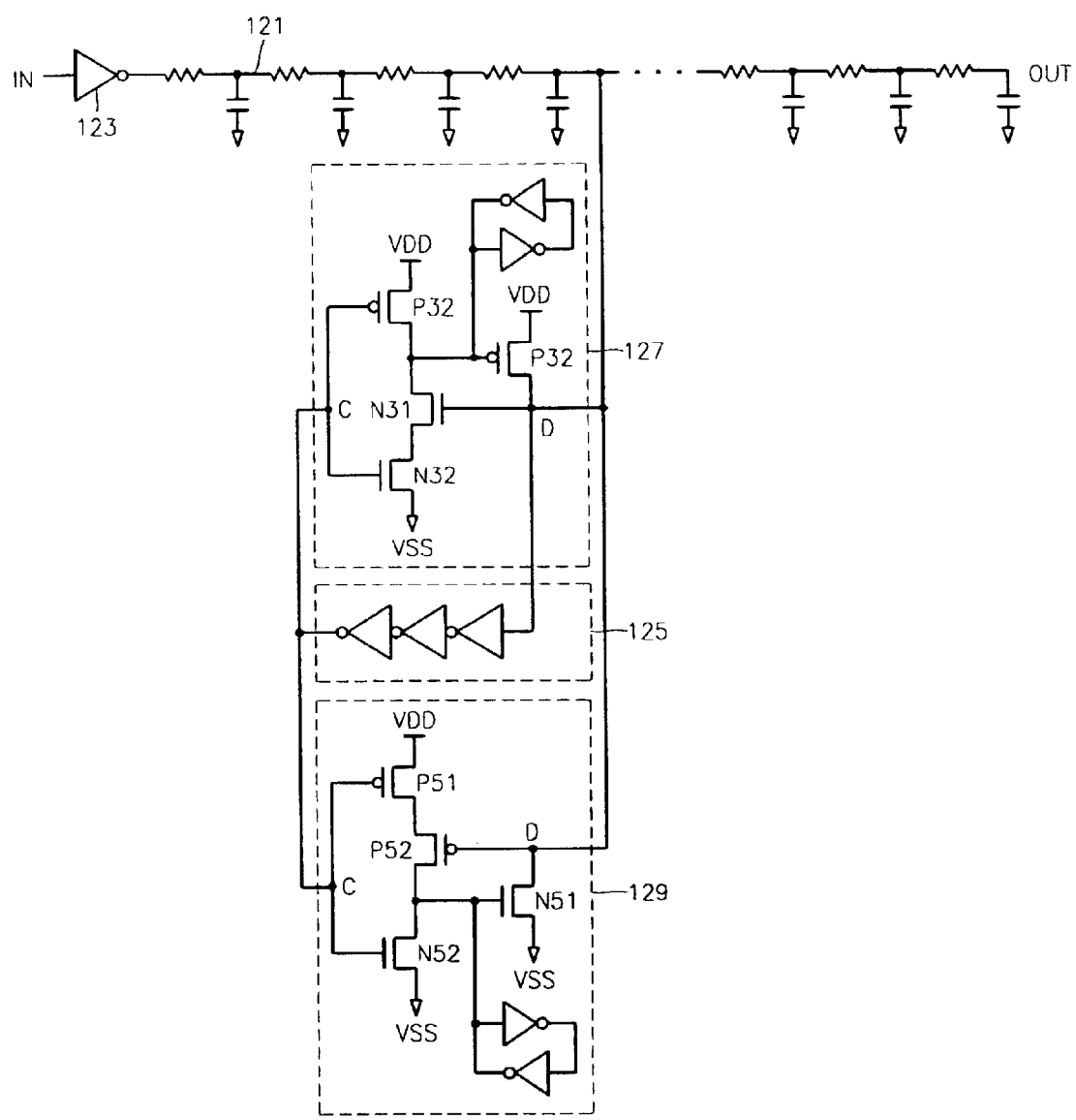
FIG. 12 illustrates a signal line driving circuit according to a second embodiment, which uses the signal buffers according to the third embodiment and the fourth embodiment.

FIG. 12 illustrates a signal line driving circuit according to a second embodiment, which uses the signal buffers according to the third embodiment and the fourth embodiment.

Referring to FIG. 12, the signal line driving circuit according to the second embodiment includes an inversion buffer 123, an inversion delay 125, a first signal buffer 127, and a second signal buffer 129.

The inversion buffer 123, having an output terminal connected to a signal line 121, receives an input signal IN to drive the signal line 121. The inversion delay 125, having an input terminal connected to a predetermined location of the signal line 121, inverts and delays the signal input through the input terminal.

The first signal buffer 127, which is a signal buffer according to the third embodiment of FIG. 8, has a control terminal C connected to an output terminal of the inversion delay 125 and an input/output terminal D connected to a predetermined location of the signal line 121. The first signal buffer 127 increases the rising transition speed of the signal propagating on the signal line 121 in response to the output signal of the inversion delay 125, which is input through the control terminal C, and the signal of the signal line 121, which is input through the input/output terminal D. In other words, the first signal buffer 127 sharpens the rising slope of the signal of the signal line 121.

The second signal buffer 129 as a signal buffer according to the fourth embodiment of FIG. 10 includes a control terminal C connected to the output terminal of the inversion delay 125 and an input/output terminal D connected to a predetermined location of the signal line 121. The second signal buffer 129 increases the falling transition speed of the signal of the signal line 121 in response to the output signal of the inversion delay 125, which is input through the control terminal C, and the signal of the signal line 121, which is input through the input/output terminal D. In other words, the second signal buffer 129 sharpens the falling slope of the signal of the signal line 121.

Here, the signal line driving circuit according to the second embodiment is described to include both the first signal buffer 127, which controls the rising slope of the signal of the signal line 121, and the second signal buffer 129, which controls the falling slope of the signal of the signal line 121. However, when necessary, the signal line driving circuit according to the second embodiment of the present invention may include only one of the first signal buffer 127 and the second signal buffer 129.

As described above, the signal buffer according to the present invention sharpens the rising slope and/or the falling slope of a signal propagating on the signal line. In this manner, the signal waveform is improved, while increasing signal transmission speed.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A signal buffer comprising:
   a pull-up driver for pulling up an input/output terminal in response to a first control signal, wherein the pull-up driver comprises a PMOS transistor having a source coupled to a voltage supply, a gate receiving the first control signal, and a drain connected to the input/output terminal; and
   a control circuit for detecting a rising transition of a signal applied to the input/output terminal in response to a second control signal applied to a control terminal in order to generate the first control signal.

2. The signal buffer of claim 1, wherein the control circuit comprises:
   a PMOS transistor having a source coupled to a voltage supply, a gate connected to the control terminal, and a drain outputting the first control signal;
   a first NMOS transistor having a drain connected to the drain of the PMOS transistor and a gate connected to the input/output terminal; and
   a second NMOS transistor having a drain connected to a source of the first NMOS transistor, a gate connected to the control terminal, and a source coupled to a ground supply.

3. The signal buffer of claim 1, further comprising:
   an inversion delay for inverting and delaying the signal applied to the input/output terminal and for providing the inverted and delayed signal to the control terminal as the second control signal; and
   a latch circuit for latching the first control signal.

4. A signal buffer comprising:
   a pull-down driver for pulling down an input/output terminal in response to a first control signal; and
   a control circuit for detecting a falling transition of a signal applied to the input/output terminal in response to a second control signal applied to a control terminal in order to generate the first control signal.

5. The signal buffer of claim 4, wherein the pull-down driver comprises an NMOS transistor having a drain coupled to the input/output terminal, a gate receiving the first control signal, and a source coupled to a ground supply.

6. The signal buffer of claim 4, wherein the control circuit comprises:
   a first PMOS transistor having a source coupled to a voltage supply and a gate connected to the control terminal;
   a second PMOS transistor having a source connected to a drain of the first PMOS transistor, a gate connected to the input/output terminal, and a drain outputting the first control signal; and
   an NMOS transistor having a drain connected to the drain of the second PMOS transistor, a gate connected to the control terminal, and a source coupled to a ground supply.

7. The signal buffer of claim 4, further comprising:
   an inversion delay for inverting and delaying the signal applied to the input/output terminal and for providing the inverted and delayed signal to the control terminal as the second control signal; and
   a latch circuit for latching the first control signal.

8. A signal line driving circuit for driving a signal line, the signal line driving circuit comprising:
   an inversion buffer receiving an input signal and including an output terminal connected to the signal line to drive the signal line;
   a control signal generator for receiving the input signal to generate a first control signal; and
   a signal buffer having a control terminal receiving the first control signal and an input/output terminal connected to a node of the signal line, the signal buffer comprising a pull-up driver for pulling up the input/output terminal in response to a second control signal and a control circuit for detecting the rising transition of the signal at the input/output terminal of the signal buffer in response to the first control signal at the control terminal in order to generate the second control signal, the signal buffer reducing a rising transition time of a signal propagating on the signal line at the node in response to the first control signal, wherein the pull-up driver comprises a PMOS transistor having a source coupled to a voltage supply, a gate receiving the second control signal, and a drain connected to the input/output terminal of the signal buffer.

9. The signal line driving circuit of claim 8 wherein the control signal generator comprises a pulse generator and wherein the first control signal comprises a pulse signal.

10. The signal line driving circuit of claim 9 wherein the control signal generator comprises a second inversion buffer and wherein the first control signal comprises an inverted and buffered control signal.

11. The signal line driving circuit of claim 8 wherein the control circuit comprises:
   a PMOS transistor having a source coupled to a power supply, a gate connected to the control terminal, and a drain outputting the second control signal;
   a first NMOS transistor having a drain connected to the drain of the PMOS transistor and a gate connected to the input/output terminal of the signal buffer; and
   a second NMOS transistor having a drain connected to a source of the first NMOS transistor, a gate connected to the control terminal, and a source coupled to a ground supply.

12. A signal line driving circuit for driving a signal line, the signal line driving circuit comprising:
   an inversion buffer receiving an input signal and including an output terminal connected to the signal line to drive the signal line;
   a control signal generator for receiving the input signal to generate a first control signal; and
   a signal buffer having a control terminal receiving the first control signal and an input/output terminal connected to a node of the signal line, the signal buffer reducing a falling transition time of a signal propagating on the signal line at the node in response to the first control signal.

13. The signal line driving circuit of claim 12 wherein the control signal generator comprises a pulse generator and wherein the first control signal comprises a pulse signal.

14. The signal line driving circuit of claim 12 wherein the control signal generator comprises a second inversion buffer and wherein the first control signal comprises an inverted and buffered control signal.

15. The signal line driving circuit of claim 12, wherein the signal buffer comprises:
   a pull-down driver for pulling down the input/output terminal of the signal buffer in response to a second control signal; and
   a control circuit for detecting the falling transition of the signal at the input/output terminal of the signal buffer in response to the first control signal at the control terminal in order to generate the second control signal.

16. The signal line driving circuit of claim 15, wherein the pull-down driver comprises an NMOS transistor having a drain connected to the input/output terminal of the signal buffer, a gate receiving the second control signal, and a source coupled to a ground supply.

17. The signal line driving circuit of claim 15, wherein the control circuit comprises:
   a first PMOS transistor having a source coupled to a voltage supply and a gate connected to the control terminal;
   a second PMOS transistor having a source connected to a drain of the first PMOS transistor, a gate connected to the input/output terminal of the signal buffer, and a drain outputting the second control signal; and
   an NMOS transistor having a drain connected to the drain of the second PMOS transistor, a gate connected to the control terminal, and a source coupled to a ground supply.

18. A signal line driving circuit for driving a signal line, the signal line driving circuit comprising:
   an inversion buffer receiving an input signal and including an output terminal connected to the signal line to drive the signal line;
   a control signal generator for receiving the input signal to generate a first control signal;
   a first signal buffer having a control terminal receiving the first control signal and an input/output terminal connected to node of the signal line, the signal buffer reducing a rising transition time of a signal propagating on the signal line at the node in response to the first control signal; and
   a second signal buffer having a control terminal receiving the first control signal and an input/output terminal connected to a node of the signal line, the signal buffer reducing a falling transition time of a signal propagating on the signal line at the node in response to the first control signal.

19. The signal line driving circuit of claim 18 wherein the control signal generator comprises a pulse generator and wherein the first control signal comprises a pulse signal.

20. The signal line driving circuit of claim 18 wherein the control signal generator comprises a second inversion buffer and wherein the first control signal comprises an inverted and buffered control signal.

21. The signal line driving circuit of claim 18, wherein the first signal buffer comprises:
   a pull-up driver for pulling up the input/output terminal of the first signal buffer in response to a second control signal; and
   a control circuit for detecting the rising transition of the signal at the input/output terminal of the first signal buffer in response to the first control signal at the control terminal in order to generate the second control signal.

22. The signal line driving circuit of claim 21, wherein the pull-up driver comprises a PMOS transistor having a source coupled to a voltage supply, a gate receiving the control signal, and a drain connected to the input/output terminal of the first signal buffer.

23. The signal line driving circuit of claim 21, wherein the control circuit comprises:
   a PMOS transistor having a source coupled to a power supply, a gate connected to the control terminal, and a drain outputting the second control signal;
   a first NMOS transistor having a drain connected to the drain of the PMOS transistor and a gate connected to the input/output terminal of the first signal buffer; and
   a second NMOS transistor having a drain connected to a source of the first NMOS transistor, a gate connected to the control terminal, and a source coupled to a ground supply.

24. The signal line driving circuit of claim 18, wherein the second signal buffer comprises:
   a pull-down driver for pulling down the input/output terminal of the second signal buffer in response to a second control signal; and
   a control circuit for detecting the falling transition of the signal at the input/output terminal of the second signal buffer in response to the first control signal at the control terminal in order to generate the second control signal.

25. The signal line driving circuit of claim 24, wherein the pull-down driver comprises an NMOS transistor having a drain connected to the input/output terminal of the second signal buffer, a gate receiving the second control signal, and a source coupled to a ground supply.

26. The signal line driving circuit of claim 24, wherein the control circuit comprises:
   a first PMOS transistor having a source coupled to a voltage supply and a gate connected to the control terminal;
   a second PMOS transistor having a source connected to a drain of the first PMOS transistor, a gate connected to the input/output terminal of the second signal buffer, and a drain outputting the second control signal; and
   an NMOS transistor having a drain connected to the drain of the second PMOS transistor, a gate connected to the control terminal, and a source coupled to a ground supply.

27. A signal line driving circuit for driving a signal line, the signal line driving circuit comprising:
   an inversion buffer receiving an input signal and including an output terminal connected to the signal line to drive the signal line;
   an inversion delay having an input terminal connected to a node of the signal line to invert and delay a signal propagating on the signal line at the node to provide a first control signal; and
   a signal buffer having a control terminal receiving the first control signal and an input/output terminal coupled to the node of the signal line, the signal buffer comprising a pull-up driver for pulling up the input/output terminal in response to a second control signal and a control circuit for detecting the rising transition of the signal at the input/output terminal of the signal buffer in response to the first control signal at the control terminal in order to generate the second control signal, the signal buffer reducing a rising transition time of the signal propagating on the signal line at the node in response to the first control signal, wherein the pull-up driver comprises a PMOS transistor having a source coupled to a voltage supply, a gate receiving the second control signal, and a drain connected to the input/output terminal of the signal buffer.

28. The signal line driving circuit of claim 27, wherein the control circuit comprises:
   a PMOS transistor having a source coupled to a power supply, a gate connected to the control terminal, and a drain outputting the second control signal;
   a first NMOS transistor having a drain connected to the drain of the PMOS transistor and a gate connected to the input/output terminal of the signal buffer; and
   a second NMOS transistor having a drain connected to a source of the first NMOS transistor, a gate connected to the control terminal, and a source coupled to the ground supply.

29. The signal line driving circuit of claim 27, wherein the signal buffer further comprises a latch circuit for latching the second control signal.

30. A signal line driving circuit for driving a signal line, the signal line driving circuit comprising:
   an inversion buffer receiving an input signal and including an output terminal connected to the signal line and receiving an input signal to drive the signal line;
   an inversion delay having an input terminal connected to a node of the signal line to invert and delay a signal propagating on the signal line at the node to provide a first control signal; and
   a signal buffer having a control terminal receiving the first control signal and an input/output terminal coupled to the node of the signal line, the signal buffer reducing a falling transition time of the signal propagating on the signal line at the node in response to the first control signal.

31. The signal line driving circuit of claim 30, wherein the signal buffer comprises:
   a pull-down driver for pulling down the input/output terminal of the signal buffer in response to a second control signal; and
   a control circuit for detecting the falling transition of the signal of the input/output terminal of the signal buffer in response to the first control signal at the control terminal in order to generate the second control signal.

32. The signal line driving circuit of claim 31, wherein the pull-down driver comprises an NMOS transistor having a drain connected to the input/output terminal of the signal buffer, a gate receiving the second control signal, and a source coupled to a ground supply.

33. The signal line driving circuit of claim 31, wherein the control circuit comprises:
   a first PMOS transistor having a source coupled to a voltage supply and a gate connected to the control terminal;
   a second PMOS transistor having a source connected to the drain of the first PMOS transistor, a gate connected to the input/output terminal of the signal buffer, and a drain outputting the second control signal; and
   an NMOS transistor having a drain connected to the drain of the second PMOS transistor, a gate connected to the control terminal, and a source coupled to a ground supply.

34. The signal line driving circuit of claim 30, wherein the signal buffer further comprises a latch circuit for latching the second control signal.

35. A signal line driving circuit for driving a signal line, the signal line driving circuit comprising:
   an inversion buffer receiving an input signal and including an output terminal connected to the signal line to drive the signal line;
   an inversion delay having an input terminal connected to a node of the signal line to invert and delay a signal propagating on the line at the node to provide a first control signal;
   a first signal buffer having a control terminal receiving the first control signal and an input/output terminal coupled to the node of the signal line, the signal buffer reducing a rising transition time of the signal propagating on the signal line at the node in response to the first control signal; and
   a second signal buffer having a control terminal receiving the first control signal and an input/output terminal coupled to the node of the signal line, the signal buffer reducing a falling transition time of the signal propagating on the signal line at the node in response to the first control signal.

36. The signal line driving circuit of claim 35, wherein the first signal buffer comprises:
   a pull-up driver for pulling up the input/output terminal of the first signal buffer in response to a second control signal; and a control circuit for detecting the rising transition of the signal at the input/output terminal of the first signal buffer in response to the first control signal at the control terminal in order to generate the second control signal.

37. The signal line driving circuit of claim 36, wherein the pull-up driver comprises a PMOS transistor having a source coupled to a voltage supply, a gate receiving the second control signal, and a drain connected to the input/output terminal of the signal buffer.

38. The signal line driving circuit of claim 36, wherein the control circuit comprises:

a PMOS transistor having a source coupled to a power supply, a gate connected to the control terminal, and a drain outputting the second control signal;

a first NMOS transistor having a drain connected to the drain of the PMOS transistor and a gate connected to the input/output terminal of the signal buffer; and a second NMOS transistor having a drain connected to a source of the first NMOS transistor, a gate connected to the control terminal, and a source coupled to the ground supply.

39. The signal line driving circuit of claim 35, wherein the first signal buffer further comprises a latch circuit for latching the control signal.

40. The signal line driving circuit of claim 35, wherein the second signal buffer comprises:

a pull-down driver for pulling down the input/output terminal of the second signal buffer in response to a second control signal; and a control circuit for detecting the falling transition of the signal of the input/output terminal of the second signal buffer in response to the first control signal at the control terminal in order to generate the second control signal.

41. The signal line driving circuit of claim 40, wherein the pull-down driver comprises an NMOS transistor having a drain connected to the input/output terminal of the second signal buffer, a gate receiving the second control signal, and a source coupled to a ground supply.

42. The signal line driving circuit of claim 40, wherein the control circuit comprises:

a first PMOS transistor having a source coupled to a voltage supply and a gate connected to the control terminal;

a second PMOS transistor having a source connected to the drain of the first PMOS transistor, a gate connected to the input/output terminal of the second signal buffer, and a drain outputting the second control signal; and an NMOS transistor having a drain connected to the drain of the second PMOS transistor, a gate connected to the control terminal, and a source coupled to a ground supply.

43. The signal line driving circuit of claim 35, wherein the second signal buffer further comprises a latch circuit for latching the second control signal.

44. A signal buffer comprising:

a pull-up driver for pulling up an input/output terminal in response to a first control signal;

a control circuit for detecting a rising transition of a signal applied to the input/output terminal in response to a second control signal applied to a control terminal in order to generate the first control signal;

an inversion delay for inverting and delaying the signal applied to the input/output terminal and for providing the inverted and delayed signal to the control terminal as the second control signal; and a latch circuit for latching the first control signal.

45. A signal line driving circuit for driving a signal line, the signal line driving circuit comprising:

an inversion buffer receiving an input signal and including an output terminal connected to the signal line to drive the signal line;

an inversion delay having an input terminal connected to a node of the signal line to invert and delay a signal propagating on the signal line at the node to provide a first control signal; and a signal buffer having a control terminal receiving the first control signal and an input/output terminal coupled to the node of the signal line, the signal buffer comprising a pull-up driver for pulling up the input/output terminal in response to a second control signal and a control circuit for detecting the rising transition of the signal at the input/output terminal of the signal buffer in response to the first control signal at the control terminal in order to generate the second control signal, the signal buffer reducing a rising transition time of the signal propagating on the signal line at the node in response to the first control signal, wherein the signal buffer further comprises a latch circuit for latching the second control signal.

* * * * *

UNITED STATES PATENT AND TRADEMARK OFFICE
CERTIFICATE OF CORRECTION

PATENT NO. : 6,777,987 B2
DATED : August 17, 2004
INVENTOR(S) : Moo-sung Chae et al.

It is certified that error appears in the above-identified patent and that said Letters Patent is hereby corrected as shown below:

Column 9,
Line 11, delete "claim 9" and insert -- claim 8 --.

Signed and Sealed this

Twenty-second Day of March, 2005

JON W. DUDAS
*Director of the United States Patent and Trademark Office*